(12) United States Patent
Crittenden et al.

(10) Patent No.: US 11,190,045 B2
(45) Date of Patent: Nov. 30, 2021

(54) APPARATUS AND METHOD FOR DETECTION OF LINE TO NEUTRAL BACK-FEED VOLTAGE

(71) Applicant: Aclara Technologies LLC, St. Louis, MO (US)

(72) Inventors: Curtis W. Crittenden, Milton, NH (US); Carl Oppenheimer, Kingston, NH (US)

(73) Assignee: Aclara Technologies, LLC, St. Louis, MO (US)

( * ) Notice: Subject to any disclaimer, the term of this patent is extended or adjusted under 35 U.S.C. 154(b) by 163 days.

(21) Appl. No.: 16/723,173

(22) Filed: Dec. 20, 2019

(65) Prior Publication Data

US 2020/0203989 A1 Jun. 25, 2020

Related U.S. Application Data

(60) Provisional application No. 62/782,450, filed on Dec. 20, 2018.

(51) Int. Cl.

| H01H 47/00 | (2006.01) |
|---|---|
| H02J 9/06 | (2006.01) |
| G01R 31/08 | (2020.01) |
| H02J 3/00 | (2006.01) |

(52) U.S. Cl.
CPC .............. H02J 9/06 (2013.01); G01R 31/086 (2013.01); H02J 3/0073 (2020.01); *H01H 2300/018* (2013.01)

(58) Field of Classification Search
CPC ........ H02J 9/06; H02J 3/0073; G01R 31/086; H01H 2300/018

USPC .......................................................... 307/115
See application file for complete search history.

(56) References Cited

U.S. PATENT DOCUMENTS

| 5,181,026 A | 1/1993 | Granville |
| 7,987,058 B1 | 7/2011 | Weber, Jr. et al. |
| 2005/0237047 A1 | 10/2005 | Voisine |

OTHER PUBLICATIONS

PCT/US2019/067946 International Search Report and Written Opinion dated Mar. 3, 2020 (15 pages).

*Primary Examiner* — Daniel Cavallari
*Assistant Examiner* — Dru Parries
(74) *Attorney, Agent, or Firm* — Michael Best & Friedrich LLP (57) ABSTRACT

An electric utility distribution system in which power is supplied by a distribution transformer through an electric utility meter including an apparatus for detecting the presence of a back-feed voltage source connected to the load. The apparatus includes a virtual neutral established in the electric utility meter at ground potential and a remote switch that is opened to interrupt electric power flow from the distribution transformer to the load. The apparatus further includes a balanced voltage divider circuit including a connection point established between a pair of series connected resistive elements. In addition, the apparatus includes a detection circuit configured to monitor a voltage signal at the connection point to detect a back-feed voltage source connected between a neutral conductor of the electric utility distribution system and one of a first or second power line at the load.

20 Claims, 11 Drawing Sheets

APPARATUS AND METHOD FOR DETECTION OF LINE TO NEUTRAL BACK-FEED VOLTAGE

FIELD

Embodiments relate to back-feed voltage detection.

SUMMARY

In North America, residential electrical service is most commonly supplied by a 120/240 3-wire single-phase distribution transformer. The transformer typically has two 120V output secondary windings connected at a common neutral point, which is typically grounded such that the voltage output from the transformer is propagated on either an output line L1 or an output line L2. The voltage measured between a respective output line and neutral is typically 120V, or 240V when voltage is measured between lines L1 and L2. Electricity consumption is most commonly metered by an American National Standards Institute (ANSI) form, 2S watt-hour meter. The ANSI, 2S watt-hour meters measure the electrical current flowing along lines L1 and L2 from the distribution transformer to a load at a customer's premises. In addition, the ANSI meter measures the voltage between lines L1 and L2 to determine the power being consumed at the load. The power consumption is integrated over time and recorded as watt-hours for billing and other purposes.

Modern electric utility meters are capable of bi-directional communication with the electric utility provider. In particular, the electric utility meter sends data to and receives commands from an external computing device operated by the electric utility provider over a Wide Area Network (WAN). Many modern electric utility meters include internal switches that are configured to disconnect a customer's electric service in response to receiving a command. This command may be generated locally at the meter, for example, when load demands excessive amounts of power. Alternatively, the command to disconnect a customer's electric service may generated at the external computing device operated by the electric utility provider, for example, when a customer fails to pay an electric bill.

When an electric utility meter's internal switch is open, the customer is disconnected from the electric utility's power distribution system. Thus, the customer receives no power when the internal switch is open. It is known, however, that in some instances, a customer may try to circumvent this inconvenience by connecting an external power source, such as an electric generator, to the customer's load-side electrical system. In some instances, a customer may connect the load-side electrical system to a neighbor's home (or other adjacent facility) using a modified extension cord or other temporary wiring assembly.

The external computing device operated by the electric utility provider may be further configured to remotely command the electric utility meter to close the internal switch to reconnect power to the load-side electrical system. If the customer has connected an external power source to the customer's load-side electrical system, as described above, the reconnection may result in an electrical fault that can lead to the damage of electrical equipment, overheating of appliances, or other unsafe conditions. Therefore, it would be desirable for an electric utility meter to detect whether the load-side electrical system is connected to an external power source before closing the internal switch and restoring power to the load-side electrical system. The presence of a load-side external power source is sometimes referred to as a "back-feed" voltage source.

A typical ANSI form, 2S electric utility meter is connected between lines L1 and L2 and does not include a neutral connection. The typical ANSI form, 2S electric utility meter includes low-voltage microprocessor circuitry having a low voltage DC electric supply. The electric utility meter further includes circuitry configured to generate the low DC voltage, said circuity typically referenced to a local electrical ground. Since electric utility meter does not include a connection to neutral, and therefore no direct reference to earth ground, the electric utility meter may be configured to use one of the transformer terminals as a ground reference. Thus, the electric utility meter is connected to a "floating ground" that is at line potential. Although the electric utility meter may readily measure the magnitude of a 240V source connected between the terminals on either the load-side or line-side of the electric utility meter, measuring the potential between a line terminal and neutral is more difficult.

The present invention addresses the above stated problem by employing an electric utility meter having a high impedance virtual neutral reference established between power lines L1 and L2. In operation, detection circuitry incorporated in the electric utility meter senses connection of an external back-feed source to a customer's load-side electrical system by connecting the load-side terminals to the virtual neutral via a capacitive impedance. In doing so, the electric utility meter is operable to readily measure the magnitude difference between the virtual neutral and the floating ground reference internal to the electric utility meter. Thus, when power flow to the load-side electrical system is disrupted, the electric utility meter is able to determine if a customer's load-side electrical system is being supplied power from an external source other than the electric utility provider.

Thus, one embodiment discloses an electric utility distribution system in which power is supplied by a distribution transformer through an electric utility meter including an apparatus for detecting the presence of a back-feed voltage source connected to the load. The apparatus includes a virtual neutral established in the electric utility meter at ground potential and a remote switch that is opened to interrupt electric power flow from the distribution transformer to the load. The apparatus further includes a balanced voltage divider circuit having a first pair of series connected resistive elements extending between a first power line running from the distribution transformer to the load through the electric utility meter and a second pair of series connected resistive elements extending between a second power line running from the distribution transformer to the load through the electric utility meter. The balanced voltage divider circuit further includes a connection point established between the second pair of series connected resistive elements. In addition, the apparatus includes a controller having an electronic processor configured to monitor a voltage signal generated at the connection point to determine whether a back-feed voltage source is connected between a neutral conductor of the electric utility distribution system and one of the first or second power lines at the load.

In another embodiment, the application provides a method for detecting the presence of a back-feed voltage source connected to a load of an electric distribution system in which electric power is supplied by a distribution transformer to the load through an electric utility meter. The method includes establishing a virtual neutral in the electric utility meter at ground potential and opening a remote switch of the electric utility meter to interrupt power flow from the distribution transformer to the load. The method further includes establishing a connection point between a second pair of series connected resistive elements of a balanced voltage divider circuit. The balanced voltage divider circuit includes a first pair of series connected resistive elements extending between a first power line running from the distribution transformer to the load through the electric utility meter and the second pair of series connected resistive elements extending between a second power line running from the distribution transformer to the load through the electric utility meter. Furthermore, the method includes monitoring, monitoring, via a controller having an electronic processor, a voltage signal generated at the connection point to determine whether a back-feed voltage source is connected between a neutral conductor of the electric utility distribution system and one of the first or second power lines at the load.

In another embodiment, the application discloses an electric utility distribution system in which electric power is supplied by a distribution transformer to a load through an electric utility meter including an apparatus for detecting the presence of a back-feed voltage source connected to the load. The apparatus includes a first virtual neutral established in the electric utility meter at ground potential, a second virtual neutral established in the electric utility meter at ground potential, and a remote switch that is opened to interrupt electric power flow from the distribution transformer to the load. The apparatus further includes a first voltage divider circuit having a first pair of series connected resistive elements extending between a first power line running from the distribution transformer to the load through the electric utility meter and the first virtual neutral, a second pair of series connected resistive elements extending between a second power line running from the distribution transformer to the load through the electric utility meter and the second virtual neutral, and a first connection point established between the second pair of series connected resistive elements. The apparatus also includes a second balanced voltage divider circuit having a third pair of series connected resistive elements extending between a first power line running from the distribution transformer to the load through the electric utility meter and the second virtual neutral, a fourth pair of series connected resistive elements extending between a second power line running from the distribution transformer to the load through the electric utility meter and the second virtual neutral, and a second connection point established between the fourth pair of series connected resistive elements. In addition, the apparatus also includes a controller having an electronic processor configured to determine a first voltage value present at the first connection point when there are no back-feed voltage sources connected between the neutral conductor and one of the first or second power lines at the load, determine a second voltage value present at the second connection point when there are no back-feed voltage sources connected between the neutral conductor and one of the first or second power lines at the load, and monitor a first voltage signal generated at the first connection point and a second voltage signal generated at the second connection point to determine whether a back-feed voltage source is connected between a neutral conductor of the electric utility distribution system and one of the first or second power lines at the load.

Other aspects of the application will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. In addition, it should be understood that the term "electric utility meter" may refer to ANSI 2S type electric utility meters, as well as any other electric utility meter types that are used to determine a customer's power consumption.

DETAILED DESCRIPTION

Figure 1:
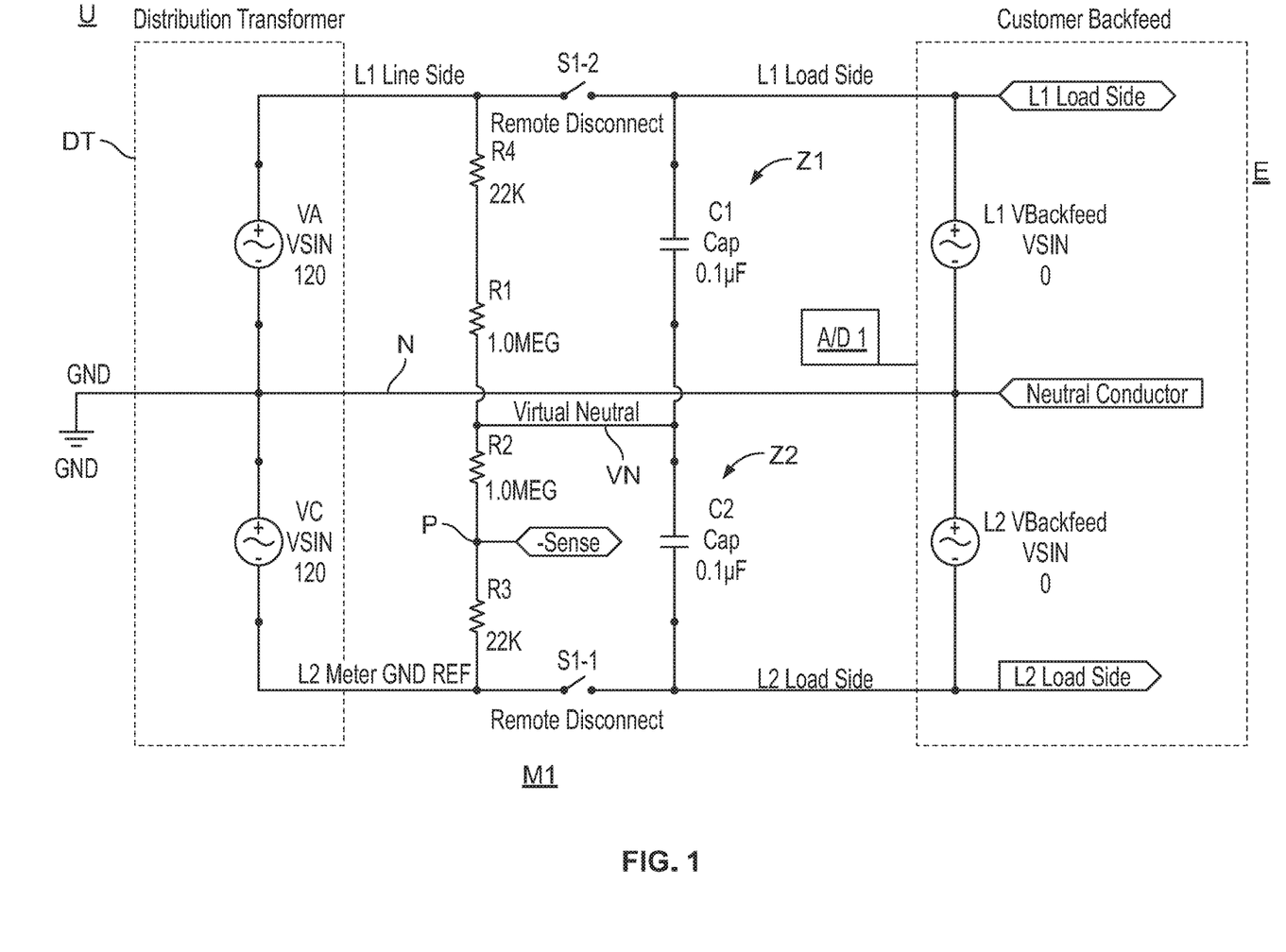
FIG. 1 is a schematic of an electric distribution system including back-feed voltage detection circuitry according to some embodiments.

FIG. 1 illustrates a schematic of an electric utility distribution system according to one embodiment of the application. A utility service provider, U, delivers electricity through the electric utility distribution system to a customer's load-side electrical system E. The electric utility distribution system includes a distribution transformer DT that supplies electrical power to the customer's load-side electrical system E through an electric utility meter M1. Electric utility meter M1, may be, but not limited to, an ANSI 2S type watt-hour meter, and includes a controller (not shown) that includes an electronic processor. The electronic processor may be, for example, a microprocessor or any other suitable programming device.

The distribution transformer DT outputs a first phase voltage, VA, at 120V between line L1 and neutral conductor N. The distribution transformer DT also outputs a second phase voltage, VC, at 120V between line L2 and neutral conductor N. According to some embodiments, the voltage output of distribution transformer DT is measured as 120V when the measurement is taken between a respective line, L1 or L2, and the neutral N. Alternatively, the voltage output of distribution transformer DT may be measured as 240V when the measurement is taken between lines L1 and L2.

Meter M1 includes a controller (not shown) having an electronic processor, for example, a microprocessor or another suitable programming device. As illustrated in FIG. 1, meter M1 further includes back-feed detection circuitry that includes a remote disconnect switch S1 having a first switch arm S1-1 in line L2 and a second switch arm S1-2 in line L1. Switch arms S1-1 and S1-2 of remote switch S1 may be controlled simultaneously, by the controller, such that when remote switch S1 is instructed to be opened or closed, switch arms S1-1 and S1-2 are simultaneously opened or closed respectively. For example, if meter M1 receives a command from the electric utility provider to open remote disconnect switch S1, both S1-1 and S1-2 will be opened simultaneously. When the remote disconnect switch S1 is opened, the flow of electric power between the distribution transformer DT and customer's load-side electrical system E is interrupted. Likewise, if meter M1 receives a command from the electric utility provider to close remote disconnect switch S1, both S1-1 and S1-2 will be closed simultaneously. When the remote disconnect switch S1 is closed, the flow of electric power between the distribution transformer DT and customer's load-side electrical system E is enabled.

Referring to FIG. 1, the back-feed detection circuitry of meter M1 further includes a virtual neutral connection VN. When there are no back-feed voltage sources connected to the customer's load-side electrical system E, the virtual neutral VN of meter M1 is established at ground potential by electrically connecting a balanced voltage divider to the virtual neutral VN. The balanced voltage divider includes a first leg, having two resistors R1 and R4, which is connected in series between line L1 and virtual neutral VN. The balanced voltage divider further includes a second leg, having two resistors R2 and R3, which is connected in series between the virtual neutral VN and line L2. Example resistance values of the resistors included in the balanced voltage divider resistors are indicated in FIG. 1; however, it should be understood that the resistance values indicated in FIG. 1 are merely provided for exemplary purposes and do not limit the balanced voltage divider from including resistors having resistance values that are different from the ones illustrated.

The second leg of the balanced voltage divider, which includes resistors R2 and R3, is further divided at a connection point P, which is located on the second leg of the voltage divider resistors R2 and R3. A sensing signal SENSE generated at point P is measured by an analog/digital (A/D) converter A/D1. According to some embodiments, meter M1's internal DC ground reference may be a "floating ground" that is at the line L2 potential. As illustrated in FIG. 1, the meter M1's ground reference may be indicated by a circuit node labeled "L2 Meter GND REF" at ground potential. Therefore, the voltage measurements of sensing signal SENSE taken by A/D1 are equivalent to a voltage drop across resistor R3 with respect to meter M1's internal ground reference.

The voltage measurements of sensing signal SENSE taken by A/D1 are monitored by the controller of meter M1 to determine whether a back-feed voltage source is connected at customer's load-side electrical system E. When there are no back-feed voltage sources connected to the customer's load-side electrical system E, the voltage sensing signal SENSE may be a voltage signal having a first voltage value (for example, 2.5V) with respect to meter M1's internal ground reference. It should also be understood that the value of voltage sensing signal SENSE may be measured and represented in any method that is preferable. For example the value of voltage sensing signal SENSE may be measured and represented as, but not limited to, an amplitude, a magnitude, an average, or a root-mean square (RMS) value.

As illustrated in FIG. 1, the back-feed detection circuitry of meter M1 further includes a first detection impedance Z1 and a second detection impedance Z2. According to some embodiments, the first detection impedance Z1 includes a capacitor C1, which is connected between line L1 and the virtual neutral VN, and the second detection impedance Z2 includes a capacitor C2, which is connected between line L2 and the virtual neutral VN. When a back-feed voltage source is connected between either line L1 or L2 and neutral N, the first and second detection impedances, Z1 and Z2, may be altered and induce a shift in the voltage of virtual neutral VN. A shift in the voltage of virtual neutral VN may alter the voltage of sensing signal SENSE that is measured by A/D1. First and second detection impedances Z1 and Z2 are not restricted to being implemented as capacitors. For example, the first and second detection impedances, Z1 and Z2, may be implemented as opto-isolators including resistors and LED-diodes. Capacitance values of the detection impedances are indicated in FIG. 1; however, it should be understood that the capacitance values depicted in FIG. 1 are merely examples and do not limit the detection impedances, Z1 and Z2, from including circuit components having capacitance and resistance values that are different from the ones illustrated.

As discussed above, shifting the voltage value of the virtual neutral VN may result in a change in the voltage of sensing signal SENSE. Accordingly, when a back-feed voltage source is connected to the customer's load-side electrical system E between a line L1 or L2 and neutral N, the value of voltage sense signal SENSE may be greater than or less than the first voltage value of the sensing signal SENSE that is measured when there are no back-feed voltage sources connected to the customer's load-side electrical system E. For example, when a back-feed voltage source (for example, an external power source such as a generator) is connected between line L1 and neutral N (L1-N), the voltage value of sensing signal SENSE may be greater than the first voltage value of the sensing signal SENSE when there are no back-feed voltage sources connected to the customer's load-side electrical system E. In a similar manner, when a back-feed voltage source (for example, a neighbor's electrical system) is connected between line L2 and neutral N (L2-N), the voltage value of sensing signal SENSE may be less than the first voltage value of the sensing signal SENSE when there are no back-feed voltage sources connected to the customer's load-side electrical system E. In some embodiments, connecting a back-feed voltage source between line L1 and neutral N may increase the voltage of sensing signal SENSE and connecting a back-feed voltage source between line L2 and neutral N may decrease the voltage of sensing signal SENSE. In addition, introducing back-feed voltage sources that are out of phase with or have different frequencies that the line-side voltages may further distort the voltage of sensing signal SENSE. For example, if the line-side voltages are delivered at a frequency of 60 Hz and a back-feed voltage source having a frequency of 50 Hz is connected between L2-N of the customer's load-side electrical system, the sensing signal SENSE may be modulated by a 10 Hz beat frequency.

The sensing signal SENSE is measured by A/D1 and monitored by the controller of meter M1 to determine whether a line to neutral (L-N) back-feed condition is present at the customer's load-side electrical system E. The controller can determine whether a back-feed voltage source is connected between line L1 and neutral N by comparing the value of the sensing signal SENSE to the first voltage value of the sensing signal SENSE that is present when there are no back-feed voltage sources connected to the customer's load-side electrical system E. For example, if the value of the sensing signal SENSE is greater than the first voltage value by a predetermined threshold, the controller of meter M1 may determine that a back-feed voltage source is connected between line L1 and neutral N of the customer's load-side electrical system. Likewise, the controller of meter M1 can determine whether back-feed voltage source is connected between line L2 and neutral N by comparing the value of the sensing signal SENSE to the first voltage value of the sensing signal SENSE that is present when there are no back-feed voltage sources connected to the customer's load-side electrical system E. For example, if the value of the sensing signal SENSE is less than the first voltage value by a predetermined threshold, the controller of meter M1 may determine that a back-feed voltage source is connected between line L2 and neutral N of the customer's load-side electrical system.

FIGS. 2A-D illustrate voltage waveforms present at various nodes of the back-feed detection circuitry of meter M1 according to FIG. 1. In particular, the voltage waveforms illustrated in FIGS. 2A-D correspond to conditions of the utility distribution system such that remote disconnect switch S1 of meter M1 is open and there are no external power sources connected to the customer's load-side electrical system E, wherein external power sources at the customer's load-side electrical system E are represented as back-feed voltage sources L1 VBackfeed and L2 VBackfeed respectively. Thus, the voltage waveforms illustrated in FIGS. 2A-D are generated when back-feed voltage sources L1 VBackfeed and L2 VBackfeed are set to zero. It should be understood that the waveforms generated correspond to the resistance and capacitance values indicated for the back-feed detection circuit elements of FIG. 1. Moreover, the waveforms are provided as exemplary visual representations of the effects of connecting back-feed voltage sources to a customer's load-side electrical system and do not limit the scope of the present application. Furthermore, all of the waveform plots are represented as voltage vs. time signals.

Figure 2A:
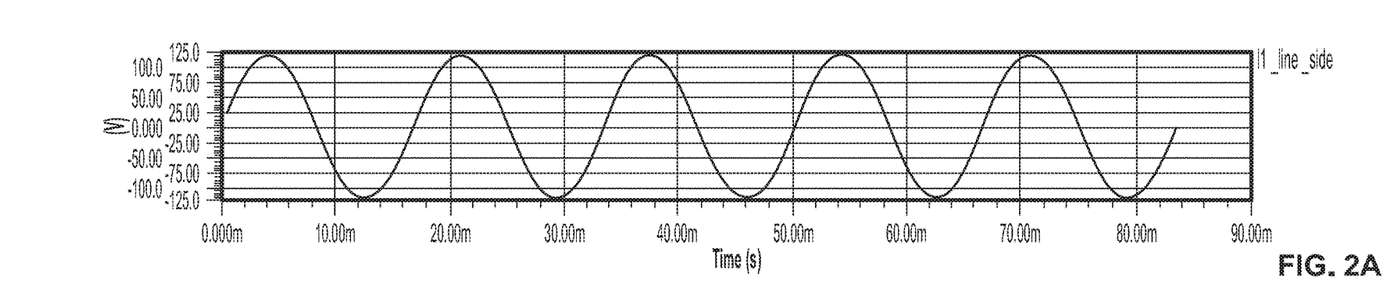
FIGS. 2A-2D illustrate a series of graphed waveforms that correspond to voltage signals generated at nodes of the electrical distribution system of FIG. 1, according to some embodiments.
Figure 2B:
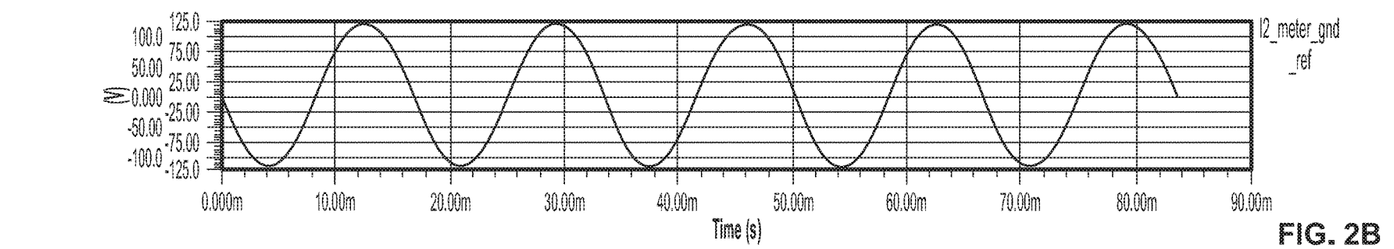
Figure 2C:
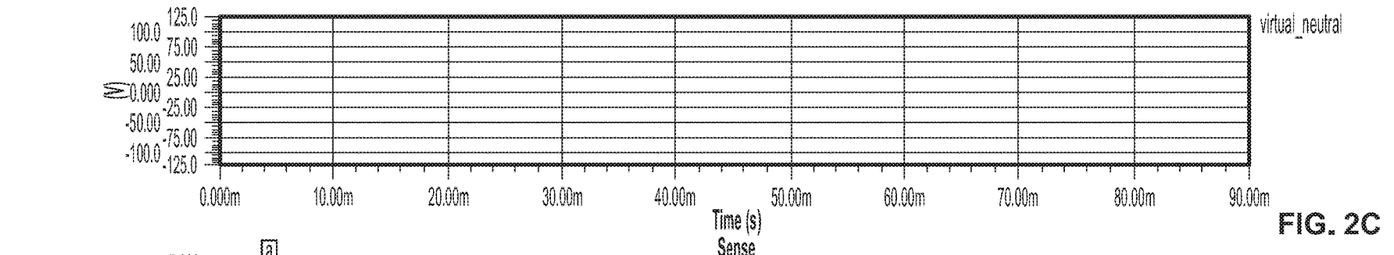
Figure 2D:
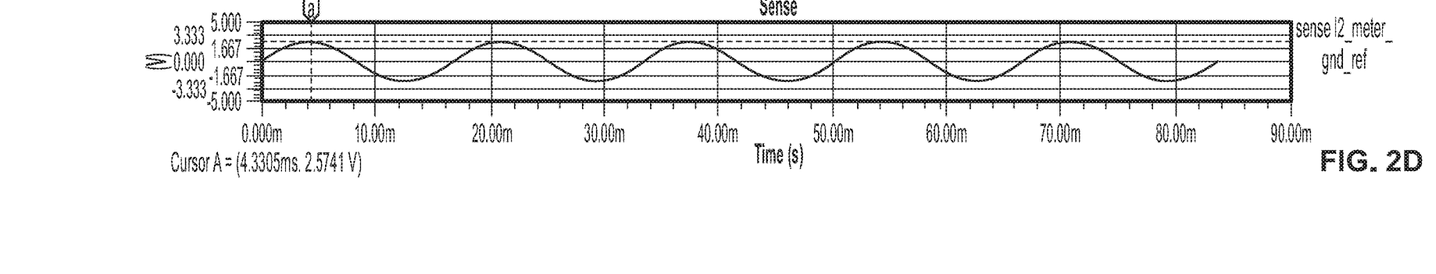

The waveforms illustrated by FIGS. 2A and 2B represent split-phase 120V AC voltages that are present on lines L1 (FIG. 2A) and L2 (FIG. 2B) respectively. FIG. 2C illustrates the voltage signal present at the virtual neutral VN of meter M1 when back-feed voltage sources L1 VBackfeed and L2 VBackfeed are set to zero, meaning there are no external power sources providing a back-feed voltage to the customer's load-side electrical system E. As illustrated in FIG. 2C, the voltage signal present at the virtual neutral VN is equal to zero, or the ground potential, when there is no back-feed voltage provided to the customer's load-side electrical system E. FIG. 2D illustrates the voltage of sensing signal SENSE that is measured by A/D1 at point P of the balanced voltage divider circuit. As illustrated in FIG. 2D, the voltage waveform of sensing signal SENSE has a first voltage value, which has an amplitude of 2.5V, when there is no back-feed voltage provided to the customer's load-side electrical system E.

Figure 3:
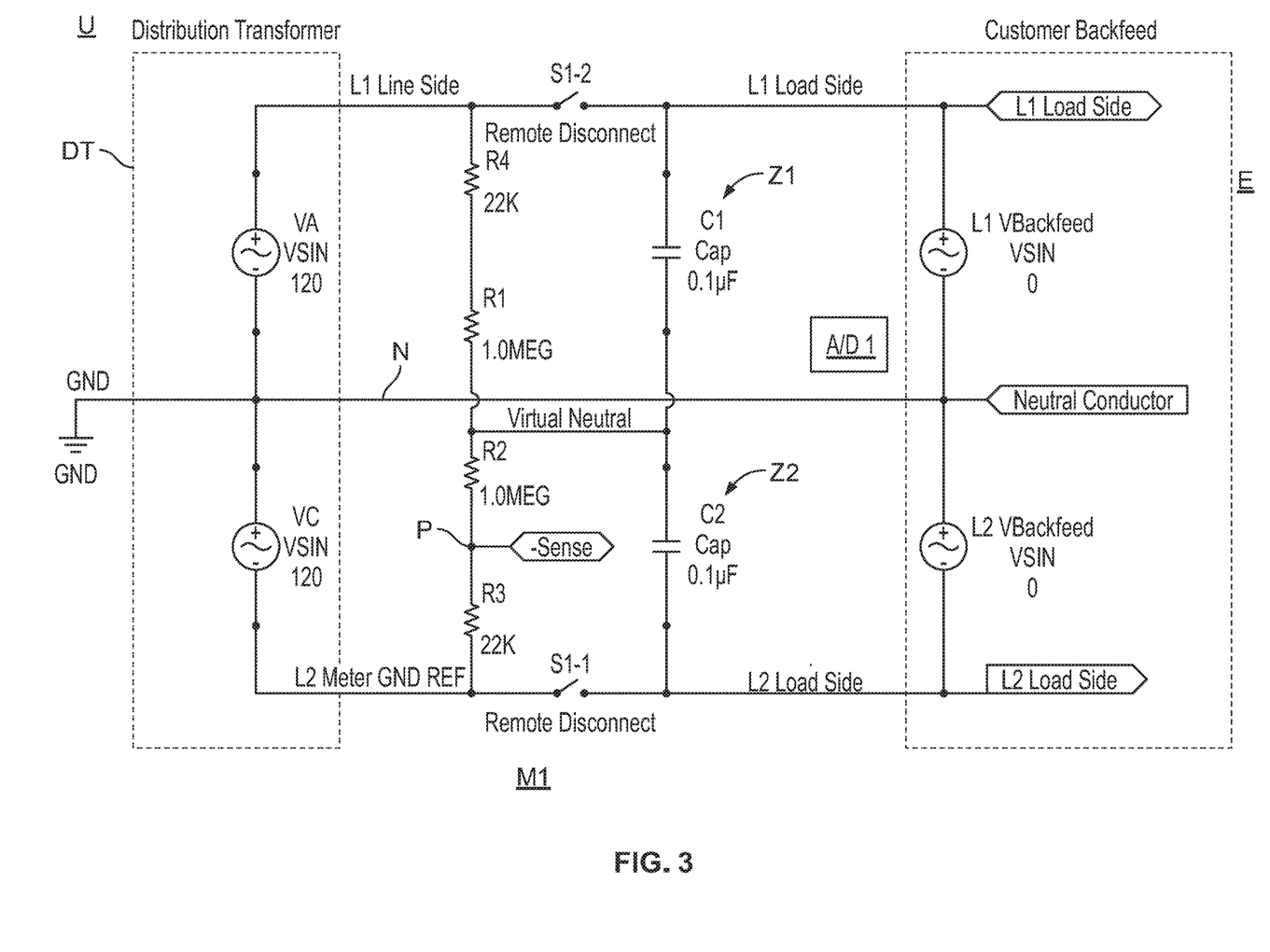
FIG. 3 is a schematic of an electric distribution system including back-feed voltage detection circuitry according to some embodiments.

FIG. 3 illustrates the electric utility distribution system illustrated by FIG. 1; however, back-feed voltage source L2 VBackfeed is now set to 120V instead of zero. Moreover, FIG. 3 illustrates the electric utility distribution system according to the embodiment illustrated by FIG. 1 when an external power source is connected to the consumer E's load-side electrical system.

Figure 4A:
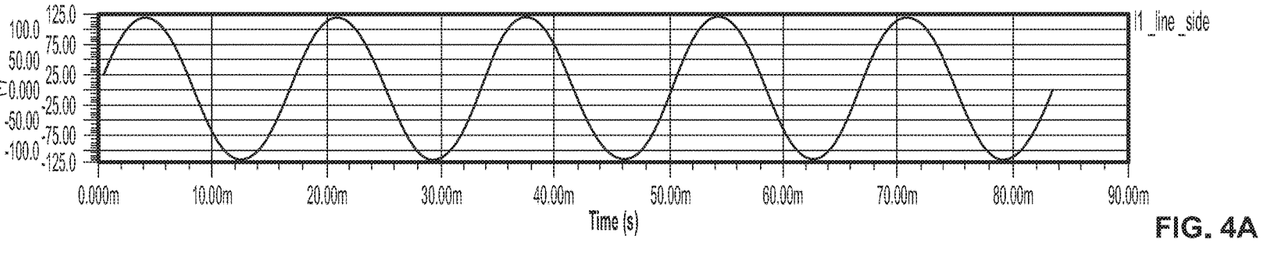
FIGS. 4A-4D illustrate a series of graphed waveforms that correspond to voltage signals generated at nodes of the electrical distribution system of FIG. 3, according to some embodiments.
Figure 4B:
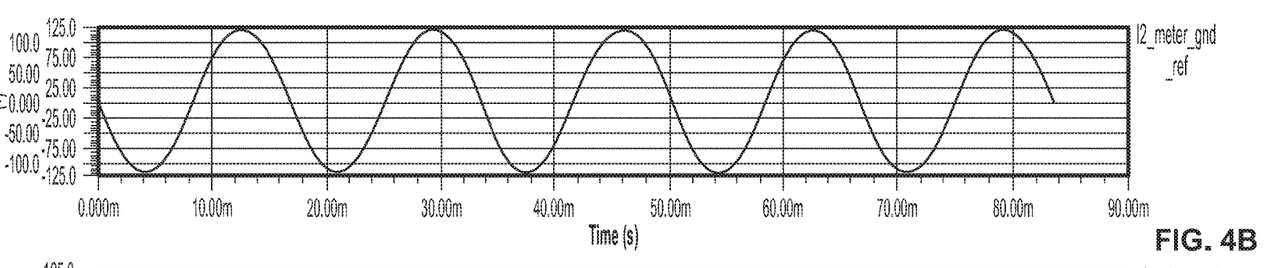
Figure 4C:
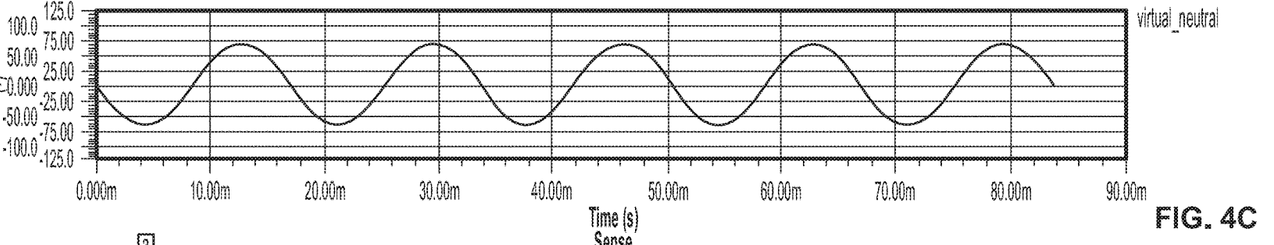
Figure 4D:
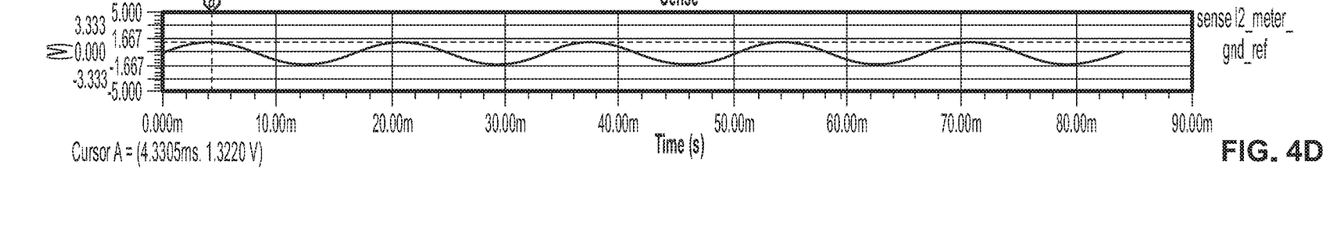

FIGS. 4A-D illustrate voltage waveforms present at various nodes of the back-feed detection circuitry of meter M1 according to FIG. 3. In particular, the voltage waveforms illustrated in FIGS. 4A-D correspond to voltage signals that are present at various nodes of the back-feed detection circuit when remote disconnect switch S1 is open and a back-feed voltage source, L2 VBackfeed, of 120V is connected between line L2 and neutral N of the customer's load-side electrical system E. The waveforms illustrated by FIGS. 4A and 4B represent split-phase 120V AC voltages that are present on lines L1 (FIG. 4A) and L2 (FIG. 4B) respectively. FIG. 4C illustrates the voltage signal present at the virtual neutral VN of meter M1. As illustrated in FIG. 4C, the voltage signal present at the virtual neutral VN is no longer equal to zero; rather, the voltage signal generated at the virtual neutral VN is a sinusoidal waveform resulting from an imbalance introduced into the voltage divider network consisting of resistors R1-R4. In particular, the voltage divider network becomes unbalanced in response to the first detection impedance Z2 being altered by the back-feed voltage source connected between line L2 and the neutral N. Therefore, connecting a back-feed voltage source, such as L2 VBackfeed, between line L2 and neutral N at customer's load-side electrical system E shifts the voltage potential present at the virtual neutral VN of meter M1 from ground potential to a non-zero voltage. As illustrated in FIG. 4D, the measured voltage of sensing signal SENSE has an amplitude of approximately 1.3V in response to the voltage of virtual neutral VN being shifted; thus, connecting a back-feed voltage source, such as L2 VBackfeed, between line L2 and neutral N at customer's load-side electrical system E may cause the first value of sensing signal SENSE to decrease (for example, from 2.5V to 1.3V). Accordingly, the controller of meter M1 may detect the decrease in the voltage of sensing signal SENSE and determine that a back-feed voltage source is connected between line L2 and neutral N at customer's load-side electrical system E.

Figure 5A:
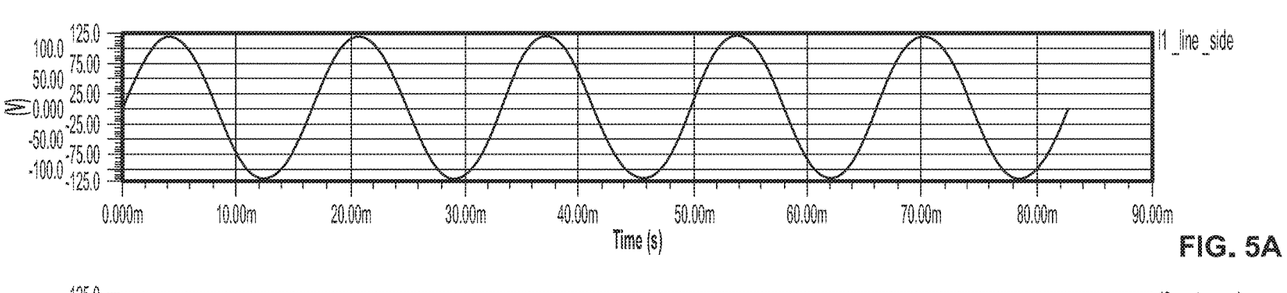
FIGS. 5A-5D illustrate a series of graphed waveforms that correspond to voltage signals generated at nodes of an electrical distribution system according to some embodiments.
Figures 5B, 5C:
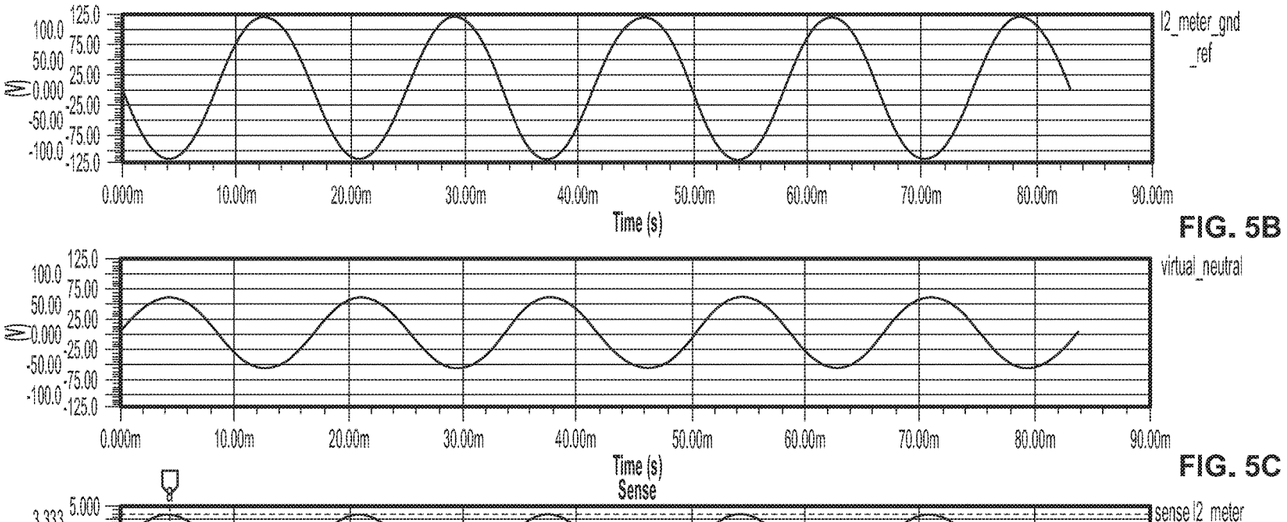
Figure 5D:
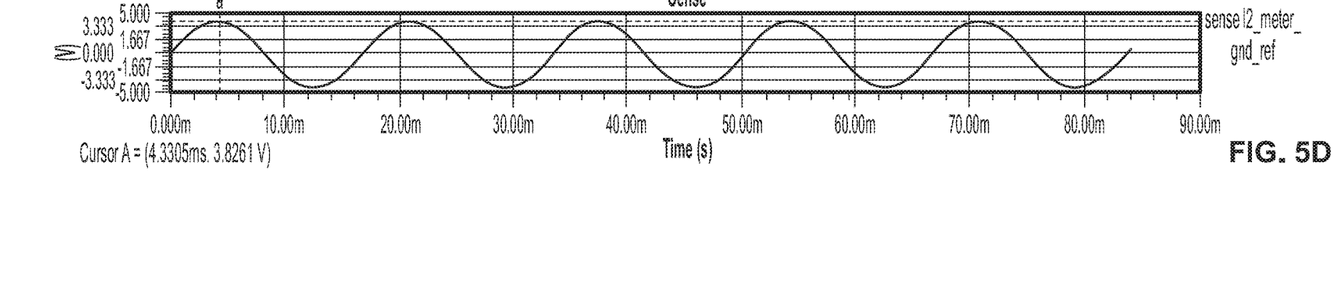

FIGS. 5A-5D, 6A-6D, and 7A-7D illustrate responses of the back-feed detection circuitry of meter M1 when other back-feed conditions (not illustrated) are present in the electric utility distribution system. In particular, the voltage waveforms illustrated in FIGS. 5A-D correspond to voltage signals that are present at various nodes of the back-feed detection circuit of meter M1 when remote disconnect switch S1 is open and a back-feed voltage source, such as V1 VBackfeed, of 120V is connected between line L1 and neutral N (L1-N) of the electric utility distribution system. The waveforms illustrated by FIGS. 5A and 5B represent split-phase 120V AC voltages that are present on lines L1 (FIG. 5A) and L2 (FIG. 5B) respectively. FIG. 5C illustrates the voltage signal present at the virtual neutral VN of meter M1. As illustrated in FIG. 5C, the voltage signal present at the virtual neutral VN is a non-zero voltage waveform resulting from an imbalance introduced into the voltage divider network consisting of resistors R1-R4. Thus, connecting a back-feed voltage source, such as L1 VBackfeed, between line L1 and neutral N at customer's load-side electrical system E may change the potential present at the virtual neutral VN of meter M1 from ground potential to a non-zero voltage. FIG. 5D illustrates the voltage of sensing signal SENSE, which has an amplitude of approximately 3.8V. Thus, connecting a back-feed voltage source, such as L2 VBackfeed, between line L2 and neutral N at customer's load-side electrical system E may cause the first value of sensing signal SENSE to increase (for example, form 2.5V to 3.8V). Accordingly, the controller of meter M1 may detect the increase in the voltage of sensing signal SENSE and determine that a back-feed voltage source is connected between line L2 and neutral N at customer's load-side electrical system E.

Figure 6A:
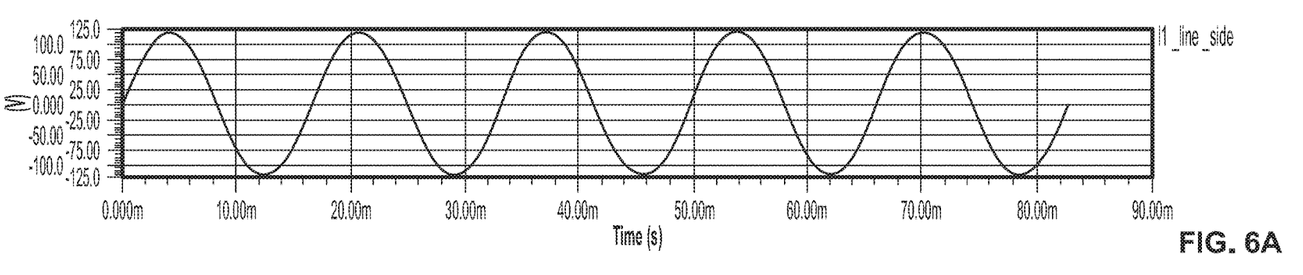
FIGS. 6A-6D illustrate a series of graphed waveforms that correspond to voltage signals generated at nodes of an electrical distribution system according to some embodiments.
Figure 6B:
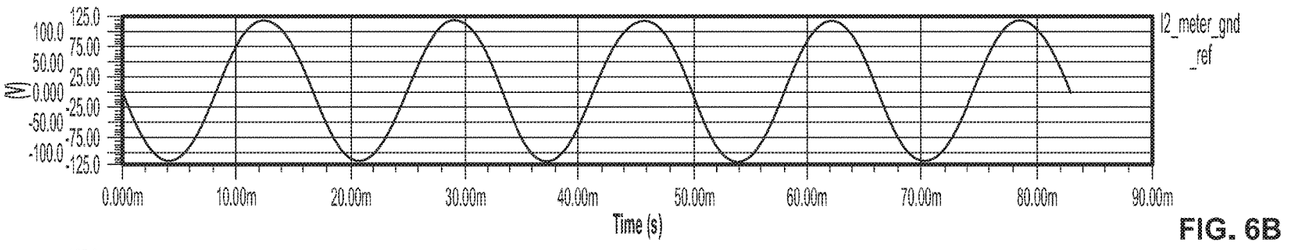
Figure 6C:
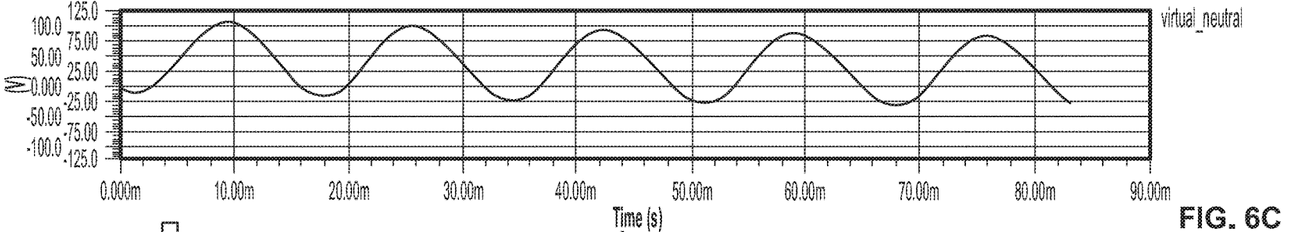
Figure 6D:
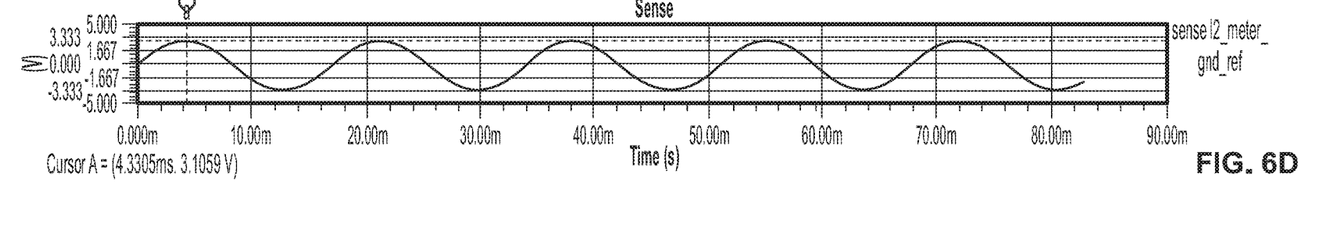

The voltage waveforms illustrated in FIGS. 6A-D correspond to voltage signals that are present at various nodes of the back-feed detection circuit of meter M1 when remote disconnect switch S1 is open and a back-feed voltage source, such as L2 VBackfeed, of 120V and 60° out-of-phase with the line-side voltages of L1 and L2 is connected between line L2 and neutral N (L2-N) of the electric utility distribution system. The waveforms illustrated by FIGS. 6A and 6B represent split-phase 120V AC voltages that are present on lines L1 (FIG. 6A) and L2 (FIG. 6B) respectively. FIG. 6C illustrates the voltage signal present at the virtual neutral VN of meter M1. As illustrated in FIG. 6C, the voltage signal present at the virtual neutral VN is an irregular waveform that is out of phase with line-side voltage present at lines L1 and L2. FIG. 6D illustrates the voltage of sensing signal SENSE, which has an amplitude of approximately 3.1V. Thus, connecting a back-feed voltage source that is out of phase with the line-side voltage sources, L1 and L2, between line L2 and neutral N (L2-N) at customer's load-side electrical system E may alter the voltage amplitude and phase of sense signal SENSE measured by A/D1.

Figure 7A:
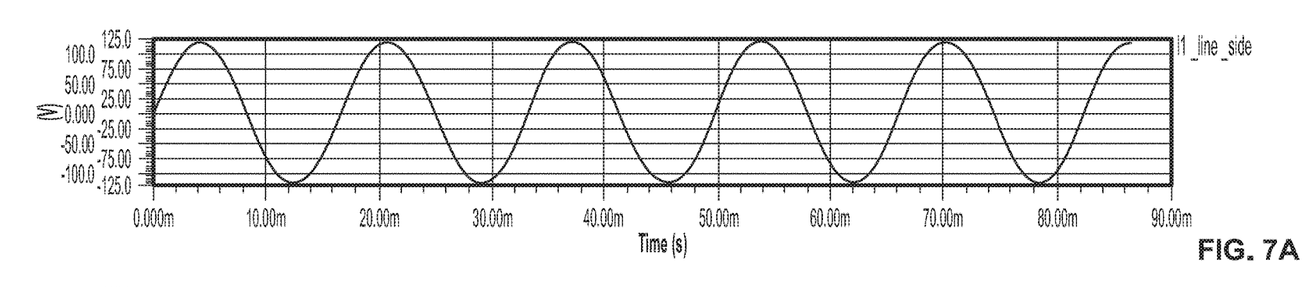
FIGS. 7A-7D illustrate a series of graphed waveforms that correspond to voltage signals generated at nodes of an electrical distribution system according to some embodiments.
Figure 7B:
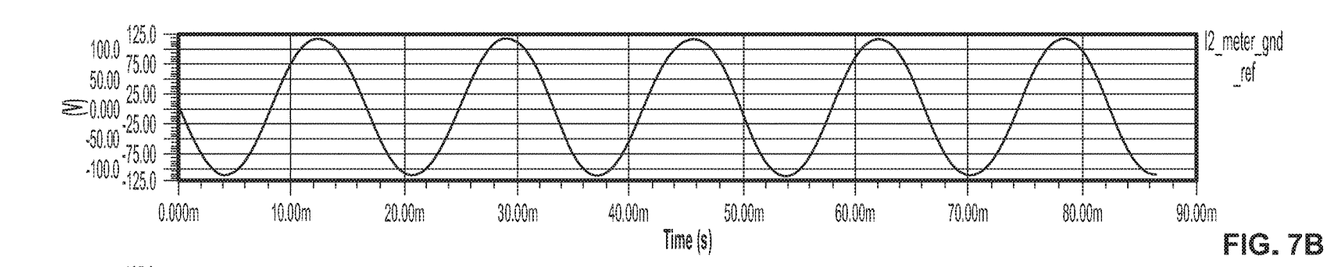
Figure 7C:
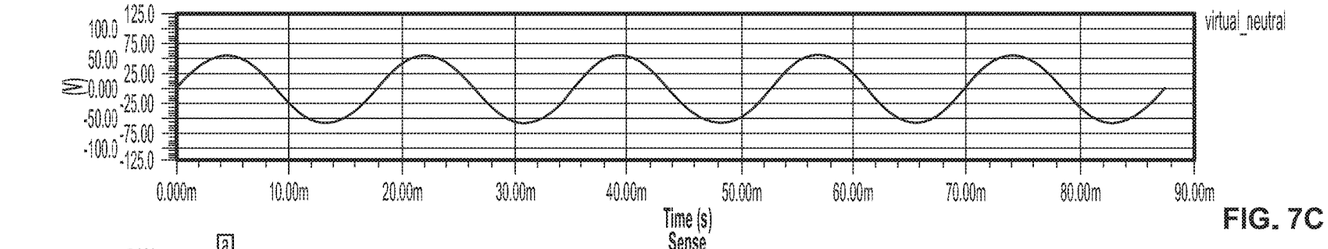
Figure 7D:
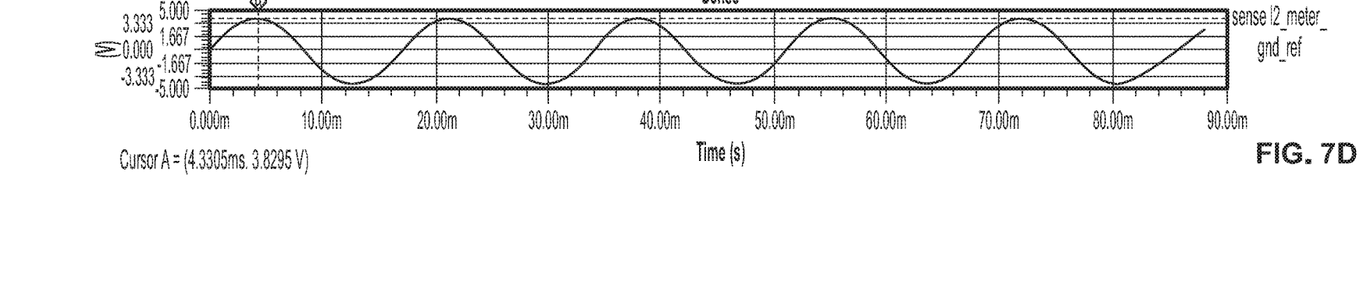

The voltage waveforms illustrated in FIGS. 7A-D correspond to voltage signals that are present at various nodes of the back-feed detection circuit when remote disconnect switch S1 is open and a 120V, 57 Hz unsynchronized back-feed voltage source that is 60° out of phase with line-side voltages L1 and L2 is connected between line L1 and neutral N (L1-N) of the electric utility distribution system. The waveforms illustrated by FIGS. 7A and 7B represent split-phase 120V AC voltages that are present on lines L1 (FIG. 7A) and L2 (FIG. 7B) respectively. FIG. 7C illustrates the non-zero voltage signal present at the virtual neutral VN of meter M1. FIG. 7D illustrates the voltage sense signal, SENSE, which is measured at point P of the balanced voltage divider circuit. As illustrated in FIG. 7D, the voltage waveform of sense signal, SENSE, has an amplitude of approximately 3.8V and is modulated by a 3 Hz beat frequency. Thus, connecting a non-60 Hz back-feed voltage source that is out of phase with the line-side voltages L1 and L2 between line L1 and neutral N (L1-N) at customer's load-side electrical system E may cause the first amplitude of sensing signal SENSE to increase (for example, form 2.5V to 3.V) and become out of phase with the line-side voltages.

Figure 8:
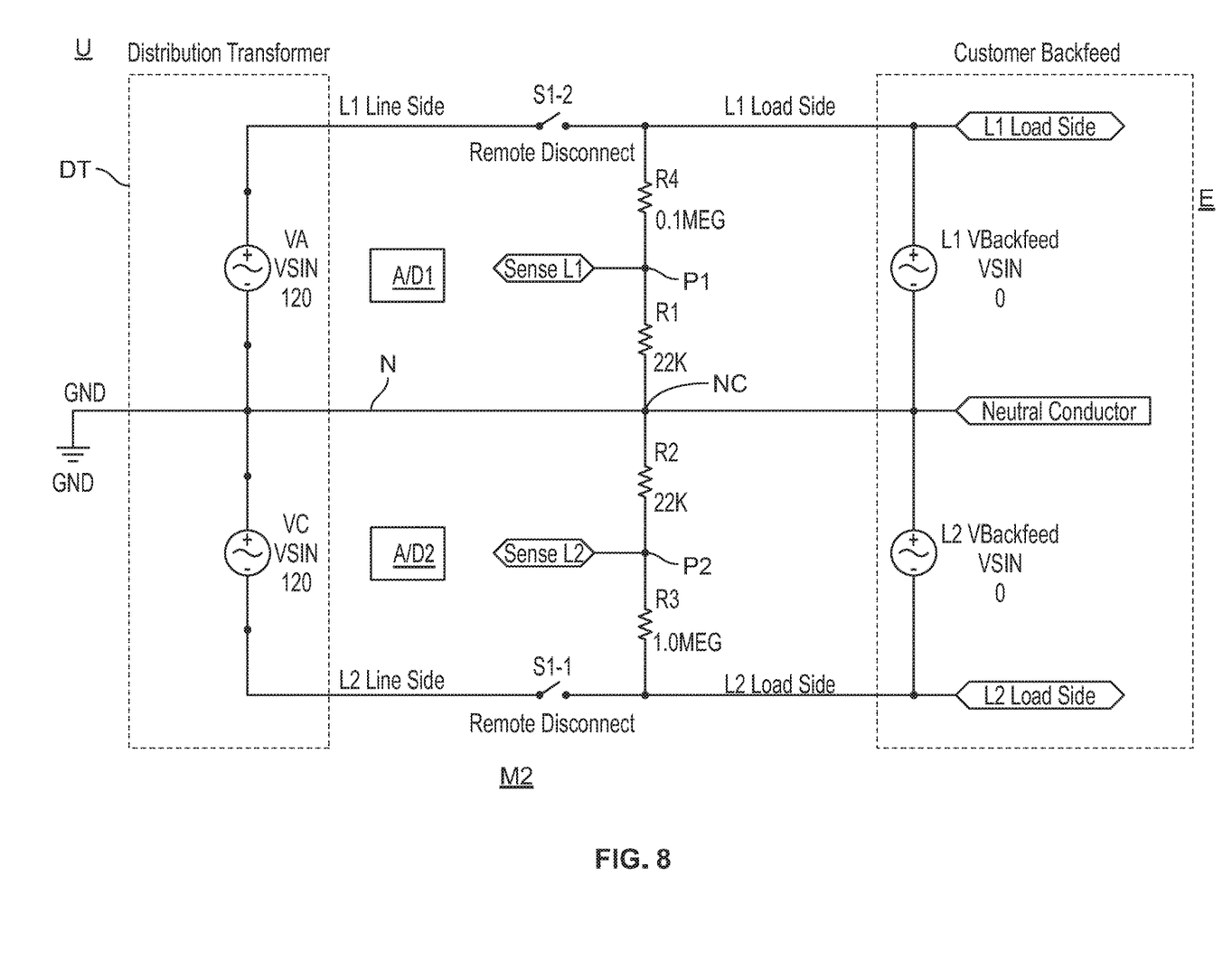
FIG. 8 is a schematic of an alternative electric distribution system including back-feed voltage detection circuitry according to some embodiments.

As described above, the configuration of meter M1, illustrated in FIGS. 1 and 3, is configured to detect when a back-feed voltage source is connected between either of line L1 and L2 and the neutral N; however, meter M1 may be less effective in detecting when a 240 V back-feed voltage source is connected between lines L1 and L2. Accordingly, FIG. 8 illustrates an electric utility meter M2, such as an ANSI 12S watt-hour meter, capable of detecting such a back-feed voltage condition.

Meter M2 includes a physical neutral connection NC, as opposed to the virtual neutral connection of meter M1. Meter M2 further includes a balanced voltage divider including a first leg connected between line L1 and neutral N and a second leg connected between line L2 and neutral N. The first leg of the balanced voltage divider includes two resistors, R1 and R4, connected in series between line L1 and neutral N. The second leg of the balanced voltage divider includes two resistors, R2 and R3, connected in series between line L2 and neutral N. Example resistance values of the resistors included in the balanced voltage divider resistors are indicated in FIG. 8; however, it should be understood that the resistance values indicated in FIG. 8 are merely provided for exemplary purposes and do not limit the balanced voltage divider from including resistors having resistance values that are different from the ones illustrated.

The first leg of the voltage divider further includes a connection point P1 located between resistors R1 and R4 at which a sensing signal SENSE L1 is produced. Sensing signal SENSE L1 is measured between line L1 and neutral connection NC. Likewise, the second leg of the voltage divider further includes a connection point P2 located between resistors R2 and R3 at which a sensing signal SENSE L2 is produced. Sensing signal SENSE L2 is measured between line L2 and neutral connection NC. Sensing signals SENSE L1 and SENSE L2 are measured by analog to digital converters A/D1 and A/D2 respectively. The measured sensing signals are monitored by a controller of meter M2 to determine whether a line to neutral or line to line back-feed voltage condition is present. In particular, the controller of meter M2 monitors the measured sensing signals SENSE L1 and SENSE L2 respectively to detect if a back-feed voltage source is connected between line L1 and neutral N, between line L2 and neutral N, or between line L1 and line L2 by determining whether the voltage of sensing signals SENSE L1 and SENSE L2 is different from a first voltage value by a predetermined threshold.

Although meter M2 is capable of detecting a line to line back-feed condition, it would be more desirable to have a meter configuration that does not require a physical neutral connection. Accordingly, FIG. 9 illustrates a modified version of meter M1, electric utility meter M3, which is capable of detecting a line L1 to neutral N back-feed condition, a line L2 to neutral N back-feed condition, and a line L1 to line L2 back-feed condition without having a physical connection to the neutral conductor N.

Figure 9:
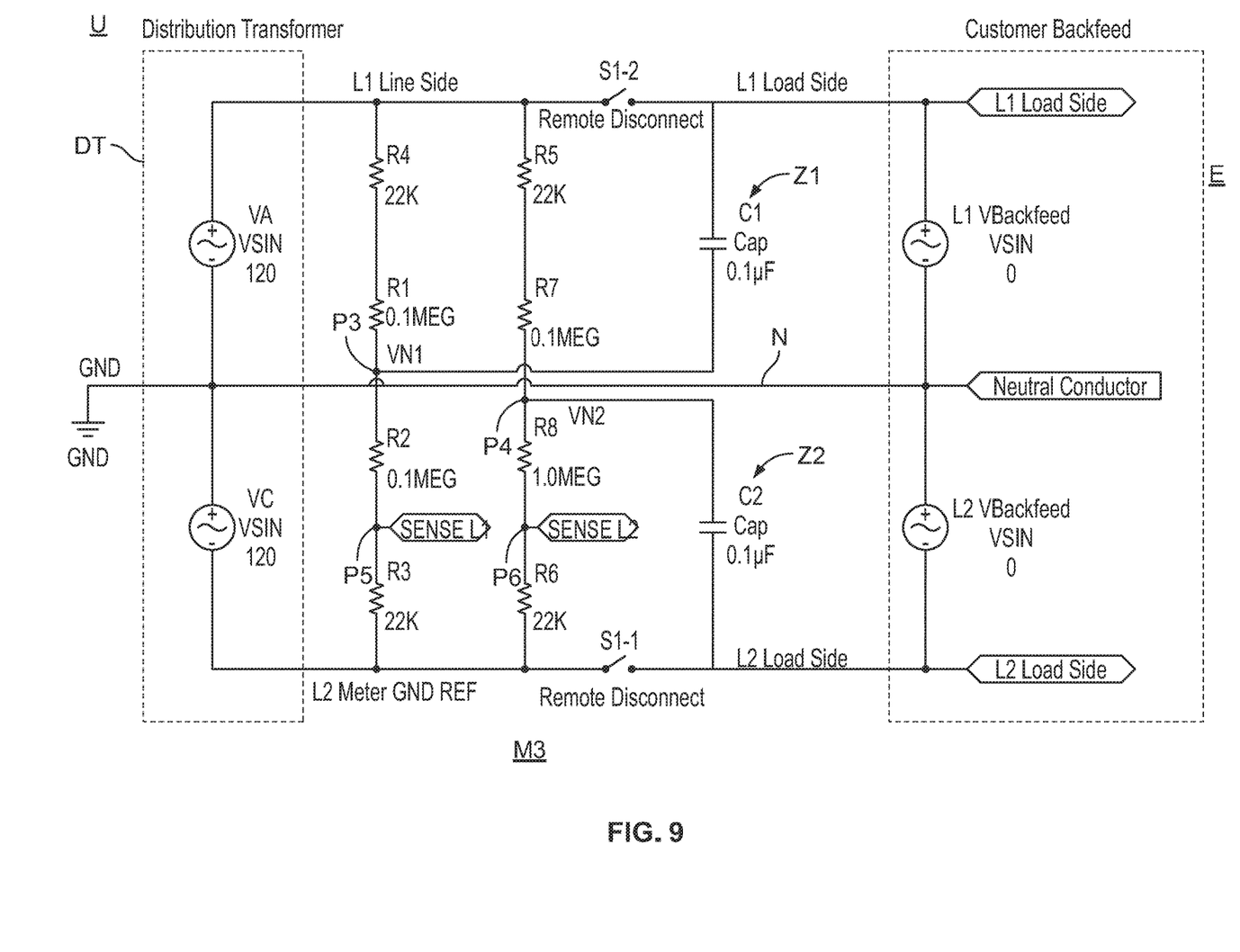
FIG. 9 is a schematic of an electric distribution system including back-feed voltage detection circuitry according to some embodiments.

Referring to FIG. 9, meter M3 includes back-feed detection circuitry having separate detection paths for lines L1 and L2. In particular, meter M3 includes a first balanced voltage divider and a second balanced voltage divider, both of which extend between lines L1 and L2. The first voltage divider includes a first leg that extends between line L1 and a first virtual neutral VN1, which includes two series connected resistors R1 and R4. A second leg of the first voltage divider extends between the first virtual neutral VN1 and line L2 and includes two series connected resistors R2 and R3. The second balanced voltage divider includes a first leg that extends between line L1 and a second virtual neutral VN2, which includes two series connected resistors R5 and R7. A second leg of the second voltage divider extends between the second virtual neutral VN2 and line L2 and includes two series connected resistors R6 and R8. The voltage potential of the first virtual neutral VN1 can be measured at point P3. Likewise, the voltage potential of the second virtual neutral VN2 can be measured at point P4. Example resistance values of the resistors included in the first and second balanced voltage divider resistors are indicated in FIG. 9; however, it should be understood that the resistance values indicated in FIG. 9 are merely provided for exemplary purposes and do not limit the first and second balanced voltage dividers from including resistors having resistance values that are different from the ones illustrated.

The second leg of the first voltage divider, which includes resistors R2 and R3, is further divided at a connection point P5, which is located between resistors R2 and R3. A sensing signal SENSE L1 is measured by an A/D converter (not shown) at point P5 and monitored by a controller (not shown) of meter M3 to detect whether a back-feed voltage condition is present between line L1 and the first virtual neutral VN1. In particular, the sensing signal SENSE L1 can be monitored to determine whether an external power source has been connected between line L1 and neutral N at the customer's load-side electrical system. Similarly, the second leg of the second voltage divider, which includes resistors R6 and R8, is further divided at a connection point P6, which is located between resistors R6 and R8. A sensing signal SENSE L2 is measured by the A/D converter at point P6 and monitored by the controller of meter M3 detect whether a back-feed voltage condition is present between line L2 and the second virtual neutral VN2. In particular, the sensing signal SENSE L2 can be monitored to indicate whether and external power source has been connected between line L2 and neutral N at the customer's load-side electrical system.

As illustrated in FIG. 9, the back-feed detection circuitry of meter M3 further includes a first detection impedance Z1 and a second detection impedance Z2. According to some embodiments, the first detection impedance Z1 includes a capacitor C1, which is connected between line L1 and the first virtual neutral VN1, and the second detection impedance Z2 includes a capacitor C2, which is connected between line L2 and the second virtual neutral VN2. When a back-feed voltage source is connected between either line L1 or L2 and neutral N, the first and second detection impedances, Z1 and Z2, may be altered and induce a shift in one of the first and second virtual neutrals, VN1 and VN2. A shift in the voltage of the first virtual neutral VN1 may alter the voltage of sensing signal SENSE L1 that is measured by the A/D converter. Likewise, a shift in the voltage of the second virtual neutral VN2 may alter the voltage of sensing signal SENSE L2 that is measured by the A/D converter. Capacitance values of the detection impedances are indicated in FIG. 9; however, it should be understood that the capacitance values depicted in FIG. 9 are merely examples and do not limit the detection impedances, Z1 and Z2, from including circuit components having capacitance and resistance values that are different from the ones illustrated. Moreover, the first and second detection impedances, Z1 and Z2, may include more or less components than capacitors C1 and C2.

Similar to the controller of meter M1, the controller of meter M3 is further configured to determine which line, L1 or L2, a back-feed voltage source is connected to at the customer's load-side electrical system E. For example, if the voltage of the sensing signal SENSE L1 measured at point P5 differs from a first voltage value of sensing signal SENSE L1, which is a predefined voltage value measured at point P5 when there is no back-feed voltage condition present, the controller of meter M3 may determine that a back-feed voltage source is connected between line L1 and neutral N. Likewise, if the voltage of the sensing signal SENSE L2 measured at point P6 differs from a second voltage value of sensing signal SENSE L2, which is a predefined voltage value measured at point P6 when there is no back-feed voltage condition present, the controller of meter M3 may determine that a back-feed voltage source is connected between line L2 and neutral N.

In addition, since the back-feed detection circuitry of meter M3 includes two virtual neutrals, VN1 and VN2, and two corresponding sensing signals, SENSE L1 and SENSE L2, the controller of meter M3 is capable of determining whether a back-feed condition is present between lines L1 and L2. For example, if the controller of meter M3 simultaneously detects the presence of both an L1-N back-feed condition and an L2-N back-feed condition, the controller of meter M3 may determine that a line L1 to line L2 back-feed condition is present, which means an external power source has been connected between lines L1 and L2 at the customer's load-side electrical system E. Thus, the configuration of meter M3 allows for electric utility meters that do not include physical neutral connections (for example, ANSI 2S watt-hour meters) to detect the presence of a line L1 to neutral N back-feed condition, the presence of a line L2 to neutral N back-feed condition, and the presence of a line L1 to line L2 back-feed condition. Furthermore, the back-feed detection circuitry of meter M3 enables the controller of meter M3 to determine which of the lines, L1 and L2, is being back-fed by an external power source.

Figure 10:
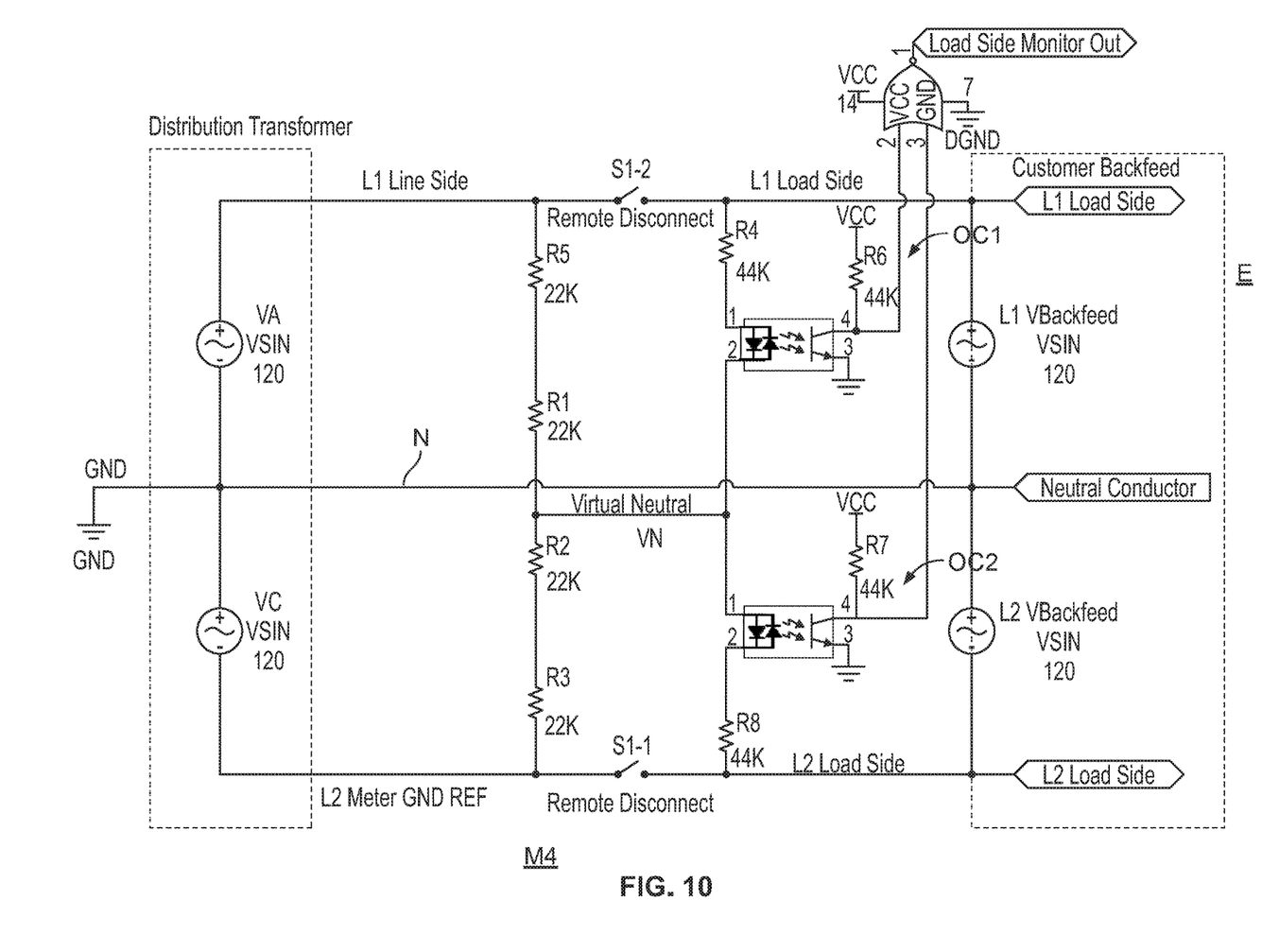
FIG. 10 is a schematic of an electric distribution system including back-feed voltage detection circuitry according to some embodiments.

FIG. 10 illustrates an alternative embodiment of an electric utility meter, meter M4, that employs the virtual neutral concepts of meters M1 and M3. As illustrated in FIG. 10, the first and second impedance detection circuits included in the back-feed detection circuitry of meters M1 and M3 may be replaced with first and second optocoupler circuits, OC1 and OC2, in the back-feed detection circuitry of meter M4. The first optocoupler circuit may include a resistor R4 and an LED diode U2 connected in series between line L1 and the virtual neutral VN. The second optocoupler circuit includes a resistor R8 and an LED diode U3 connected in series between the virtual neutral VN and line L2. The outputs of the first and second optocoupler circuits may be directly monitored by a controller (not shown) of meter M4 to determine whether a back-feed condition is present at the customer's load-side electrical system E. For example, the output of the first optocoupler circuit may be monitored by the controller of meter M4 to detect the presence of a back-feed voltage source that is connected between line L1 and the neutral N. Likewise, the output of the second optocoupler circuit may be monitored by the controller of meter M4 to detect the presence of a back-feed voltage source that is connected between line L2 and the neutral N. In addition, if the controller of meter M4 simultaneously detects the presence of both an L1-N back-feed condition and an L2-N back-feed condition based on the outputs of the first and second optocoupler circuits OC1 and OC2, the controller of meter M4 may determine that a line L1 to line L2 back-feed condition is present. Resistance values of the optocoupler circuits and voltage divider are indicated in FIG. 10; however, it should be understood that the resistance values depicted in FIG. 10 are merely examples and do not limit the first and second optocoupler circuits, OC1 and OC2, and voltage divider from including circuit components having resistance values that are different from the ones illustrated. Moreover, the first and second optocoupler circuits, OC1 and OC2, may include more or less components than are illustrated.

Figure 11:
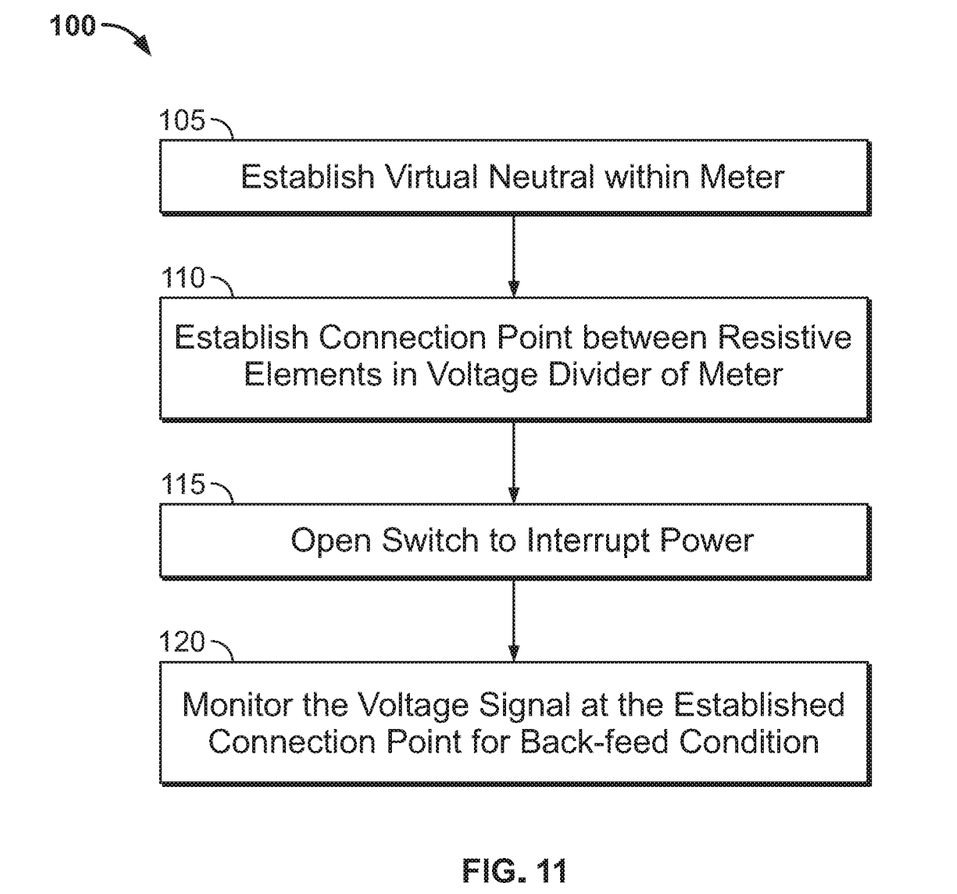
FIG. 11 is a flowchart illustrating the process or operation of an electric distribution system including back-feed voltage detection circuitry according to some embodiments.

FIG. 11 is a flowchart illustrating a process, or operation, 100 for detecting the connection of a back-feed voltage source at a customer's load-side electrical system according to one embodiment. It should be understood that the order of the steps disclosed in process 100 could vary. Furthermore, additional steps may be added and not all of the steps may be required. Accordingly, process 100 includes establishing a virtual neutral within back-feed detection circuitry of an electric utility meter (block 105). A connection point is established between series connected resistive elements of a voltage divider included in the back-feed detection circuitry of the electric utility meter (block 110). A switch within the back-feed detection circuitry of the electric utility meter is opened to interrupt flow of electric power to a load (block 115). When the switch is opened, the electric utility meter monitors a voltage signal at the established connection point to determine whether a back-feed voltage source is connected at the load (block 120).

Thus, the application provides, among other things, a system and method for detecting a presence of a back-feed voltage source connected to a customer's load-side electrical system. Various features and advantages of the application are set forth in the following claims.

What is claimed is:

1. An electric utility distribution system in which electric power is supplied by a distribution transformer to a load through an electric utility meter including an apparatus for detecting the presence of a back-feed voltage source connected to the load, the apparatus comprising:
a virtual neutral established in the electric utility meter at ground potential;
a remote switch that is opened to interrupt electric power flow from the distribution transformer to the load;
a balanced voltage divider circuit comprising:
a first pair of series connected resistive elements extending between a first power line running from the distribution transformer to the load through the electric utility meter;
a second pair of series connected resistive elements extending between a second power line running from the distribution transformer to the load through the electric utility meter;
a connection point established between the second pair of series connected resistive elements;
a controller having an electronic processor configured to monitor a voltage signal generated at the connection point to determine whether a back-feed voltage source is connected between a neutral conductor of the electric utility distribution system and one of the first or second power lines at the load.

2. The apparatus of claim 1, wherein the voltage signal at the connection point is measured by an analog to digital converter.

3. The apparatus of claim 1, wherein the voltage signal at the connection point is equal to a first value when there are no back-feed voltage sources connected between the neutral conductor and one of the first or second power lines at the load.

4. The apparatus of claim 3, wherein the controller determines that a first back-feed voltage source is connected between the neutral conductor and the first power line when a value of the voltage signal generated at the connection point differs from the first value by a first predetermined threshold.

5. The apparatus of claim 1 further comprising a first detection impedance connected between the first power line and the virtual neutral.

6. The apparatus of claim 5, wherein the first detection impedance includes a first capacitor connected between the first power line and the virtual neutral configured to shift the potential of the virtual neutral when a first back-feed voltage source is connected between the neutral conductor and the first power line.

7. The apparatus of claim 5, wherein the first detection impedance is replaced by a first optocoupler circuit connected between the first power line and the virtual neutral, the first optocoupler circuit comprising:
a first resistor and a first LED connected in series between the first power line and the virtual neutral; and
a first output lead connected to a first input of the controller.

8. The apparatus of claim 3, wherein the controller determines that a second back-feed voltage source is connected between the neutral conductor and the second power line when a value of the voltage signal generated at the connection point differs from the first value by a second predetermined threshold.

9. The apparatus of claim 1 further comprising a second detection impedance connected between the second power line and the virtual neutral.

10. The apparatus of claim 9, wherein the second detection impedance includes a second capacitor connected between the second power line and the virtual neutral configured to shift the potential of the virtual neutral when a second back-feed voltage source is connected between the neutral conductor and the second power line.

11. The apparatus of claim 9, wherein the second detection impedance is replaced by a second optocoupler circuit connected between the virtual neutral and the second power line, the second optocoupler circuit comprising:
a second resistor and a second LED connected in series between the virtual neutral and the second power line; and
a second output lead connected to a second input of the controller.

12. A method of detecting the presence of a back-feed voltage source connected to a load of an electric distribution system in which electric power is supplied by a distribution transformer to the load through an electric utility meter, the method comprising:
establishing a virtual neutral in the electric utility meter at ground potential;
opening a remote switch of the electricity utility meter to interrupt power flow from the distribution transformer to the load;
establishing a connection point between a second pair of series connected resistive elements of a balanced voltage divider circuit comprising:
a first pair of series connected resistive elements extending between a first power line running from the distribution transformer to the load through the electric utility meter; and
the second pair of series connected resistive elements extending between a second power line running from the distribution transformer to the load through the electric utility meter; and
monitoring, via a controller having an electronic processor, a voltage signal generated at the connection point to determine whether a back-feed voltage source is connected between a neutral conductor of the electric utility distribution system and one of the first or second power lines at the load.

13. The method of claim 12 further comprising, measuring, via an analog to digital converter, the voltage signal generated at the connection point.

14. The method of claim 12, wherein the voltage signal at the connection point is equal to a first value when there are no back-feed voltage sources connected between the neutral conductor and one of the first or second power lines at the load.

15. The method of claim 14 further comprising, determining, via the controller, that a first back-feed voltage source is connected between the neutral conductor and the first power line when a value of the voltage signal generated at the connection point differs from the first value by a first predetermined threshold.

16. The method of claim 14 further comprising, determining, via the controller, that a second back-feed voltage source is connected between the neutral conductor and the second power line when a value of the voltage signal generated at the connection point differs from the first value by a second predetermined threshold.

17. An electric utility distribution system in which electric power is supplied by a distribution transformer to a load through an electric utility meter including an apparatus for detecting the presence of a back-feed voltage source connected to the load, the apparatus comprising:
   a first virtual neutral established in the electric utility meter at ground potential;
   a second virtual neutral established in the electric utility meter at ground potential;
   a remote switch that is opened to interrupt electric power flow from the distribution transformer to the load;
   a first voltage divider circuit comprising:
      a first pair of series connected resistive elements extending between a first power line running from the distribution transformer to the load through the electric utility meter and the first virtual neutral;
      a second pair of series connected resistive elements extending between a second power line running from the distribution transformer to the load through the electric utility meter and the second virtual neutral; and
      a first connection point established between the second pair of series connected resistive elements;
   a second balanced voltage divider circuit comprising:
      a third pair of series connected resistive elements extending between a first power line running from the distribution transformer to the load through the electric utility meter and the second virtual neutral;
      a fourth pair of series connected resistive elements extending between a second power line running from the distribution transformer to the load through the electric utility meter and the second virtual neutral; and
      a second connection point established between the fourth pair of series connected resistive elements; and
   a controller having an electronic processor configured to:
      determine a first voltage value present at the first connection point when there are no back-feed voltage sources connected between the neutral conductor and one of the first or second power lines at the load;
      determine a second voltage value present at the second connection point when there are no back-feed voltage sources connected between the neutral conductor and one of the first or second power lines at the load; and
      monitor a first voltage signal generated at the first connection point and a second voltage signal generated at the second connection point to determine whether a back-feed voltage source is connected between a neutral conductor of the electric utility distribution system and one of the first or second power lines at the load.

18. The apparatus of claim 17, wherein the controller is further configured to determine that a first back-feed voltage source is connected between the neutral conductor and the first power line when a value of the first voltage signal generated at the first connection point differs from the first voltage value by a first predetermined threshold.

19. The apparatus of claim 17, wherein the controller is further configured to determine that a second back-feed voltage source is connected between the neutral conductor and the second power line when a value of the second voltage signal generated at the second connection point differs from the second voltage value by a second predetermined threshold.

20. The apparatus of claim 17, wherein the controller is further configured to determine that a third back-feed voltage source is connected between the first power line and the second power line when a value of the first voltage signal generated at the first connection point differs from the first voltage value by a first predetermined threshold and a value of the second voltage signal generated at the second connection point differs from the second voltage value by a second predetermined threshold.

* * * * *